(12) United States Patent
Yang et al.

(10) Patent No.: US 7,920,383 B2
(45) Date of Patent: Apr. 5, 2011

(54) HEAT SINK FOR DISSIPATING HEAT AND APPARATUS HAVING THE SAME

(75) Inventors: Jin-Kyu Yang, Seoul (KR); Dong-Woo Shin, Cheonan-si (KR); Hyun-Jong Oh, Cheonan-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 107 days.

(21) Appl. No.: 12/265,101

(22) Filed: Nov. 5, 2008

(65) Prior Publication Data

US 2009/0116195 A1 May 7, 2009

(30) Foreign Application Priority Data

Nov. 5, 2007 (KR) .................. 10-2007-0111922

(51) Int. Cl.
*H05K 7/20* (2006.01)
(52) U.S. Cl. ....... 361/704; 165/80.2; 165/185; 257/719; 361/710; 361/715; 361/719
(58) Field of Classification Search .................. 257/719; 361/719
See application file for complete search history.

(56) References Cited

U.S. PATENT DOCUMENTS

| | | | | |
|---|---|---|---|---|
| 5,109,318 A * | 4/1992 | Funari et al. | | 361/710 |
| 5,966,287 A * | 10/1999 | Lofland et al. | | 361/704 |
| 6,449,156 B1 * | 9/2002 | Han et al. | | 361/704 |
| 6,483,702 B1 * | 11/2002 | Lofland | | 361/704 |
| 7,365,985 B1 * | 4/2008 | Ni | | 361/715 |
| 7,391,613 B2 * | 6/2008 | Lai et al. | | 361/700 |
| 7,457,122 B2 * | 11/2008 | Lai et al. | | 361/704 |
| 7,483,273 B2 * | 1/2009 | Uehara et al. | | 361/715 |
| 2004/0250989 A1 * | 12/2004 | Im et al. | | 165/80.1 |
| 2007/0153486 A1 * | 7/2007 | Chen | | 361/715 |
| 2008/0089034 A1 * | 4/2008 | Hoss et al. | | 361/721 |

FOREIGN PATENT DOCUMENTS

| | | |
|---|---|---|
| JP | 11-354701 | 12/1999 |
| JP | 2001-196516 | 7/2001 |
| KR | 20060090205 | 8/2006 |

* cited by examiner

*Primary Examiner* — Gregory D Thompson
(74) *Attorney, Agent, or Firm* — Stanzione & Kim, LLP

(57) ABSTRACT

A heat sink includes first and second base plates to contact with first and second surfaces of a heat source, respectively. The first base plate includes a support unit protruding from a first surface and a first dissipating unit to dissipate heat from the heat source. The second base plate includes a penetrating hole spaced apart from an edge portion to hold the support unit and a second dissipating unit to dissipate the heat from the heat source. A coupling member is positioned on an upper surface of the support unit and applies a force to the first and second base plates to thereby combine the first and second base plates to the heat source. The base plates are combined to the memory module without any loss of the surface area of the dissipating fin, to thereby improve the dissipation efficiency of the heat sink.

19 Claims, 5 Drawing Sheets

HEAT SINK FOR DISSIPATING HEAT AND APPARATUS HAVING THE SAME

CROSS-REFERENCE TO RELATED APPLICATIONS

This application claims priority under 35 U.S.C. §119 from Korean Patent Application No. 2007-111922, filed on Nov. 5, 2007 in the Korean Intellectual Property Office (KIPO), the contents of which are herein incorporated by reference in their entirety.

BACKGROUND

1. Field

Example embodiments of the present general inventive concept relate to an apparatus to dissipate heat, and more particularly, to a heat sink having an enlarged dissipating surface and an improved dissipation capability and an apparatus having the same heat sink.

2. Description of the Related Art

Various recent electronic instruments are electrically connected to a memory module in which a plurality of memory packages is mounted on a printed circuit board (PCB) through at least one electrical connection terminal. The memory package generally includes a plurality of semiconductor chips that is electrically connected to an external electric circuit by a packaging process.

When the memory package including the semiconductor chips is electrically operated for a long time, the semiconductor chip generally has a high temperature due to heat caused by the electric power that is consumed in the semiconductor chip. High chip temperature usually causes reliability deterioration of the individual semiconductor chip. The reliability deterioration of each semiconductor chip finally results in an operational failure of the electronic instrument including the memory module that is composed of the semiconductor chips.

For that reason, heat dissipation from each of the semiconductor chips has been a significant factor for increasing electrical reliability of the memory package and the memory module. Particularly, various research on the heat dissipation from the memory module have been intensively carried out in accordance with recent technical trends in a semiconductor device such as a substrate with a small-size, high-integration degree, high operation speed and light and thin characteristics. As a result of the research, a fin-type heat sink has been suggested and widely used for improving the heat dissipation of the chip in which a plurality of fins is located on or over a heat source such as the semiconductor chip. The fin on the heat source enlarges a surface area as much as possible through which the heat generated from the chip is transferred to surroundings.

FIG. 1 is a perspective view illustrating a conventional fin-type heat sink 90 for dissipating heat from a memory module.

Referring to FIG. 1, the conventional fin-type heat sink 90 includes a pair of base plates 10, and each of the plates 10 includes a first surface 10a to which a contact pad having an excellent thermal conductivity is adhered and a second surface 10b opposite to the first surface 10a and to which a plurality of dissipating fins 12 are mounted.

The contact pad makes physical contact with an upper portion of a memory package located in the memory module M and absorbs the heat from the memory package in operating the memory module M. The plurality of the dissipation fins 12 protrudes from the second surface 10b by a predetermined height and is integrally formed together with the base plate 10 in one body at a predetermined gap distance. That is, the dissipation fins 12 are spaced apart from each other by a gap distance in a first direction I and extend in a second direction II to be disposed in parallel with each other. Each of the dissipating fins 12 has a length L much greater than a width w, and thus has a sufficiently large surface area S. The dissipation fins 12 also have a height from the base plate 10 in a third direction III.

The heat in the memory module is sufficiently transferred to the base plate 10 due to the excellent thermal conductivity of the contact pad and is rapidly dissipated to the surroundings due to the sufficiently large surface area of the dissipating fins 12. The efficiency of the heat dissipation is determined by the surface area S of the dissipation fin 12 as well as the thermal conductivity of the contact pad.

In general, the pair of the base plates 10 makes contact with an upper surface and a lower surface of the memory module M, respectively, and each of the base plates 10 is individually located on the upper and lower surfaces of the memory module M. Therefore, a coupling unit 20 is provided to fix the individual dissipating fin 12 to the upper and lower surfaces of the memory module M to thereby form a pair of the base plates 10 coupling with each other.

A clip having a great elastic coefficient is usually used as the coupling unit 20. For example, the clip is formed into a general U-shape and includes a clipping portion 22 making contact with the second surface 10b of each base plate 10 and a body 24 connected to the clipping portion 22.

The dissipation fin 12 is partially removed from the second surface 10b of the base plate 10 along the second direction II such that the dissipating fins 12 are discontinued on the base plate 10 and spaced-apart from each other in the second direction II, to thereby form a clip area 14 on the second surface 10b of the base plate 10 to accommodate the clipping portion 22 of the clip 20. The clip area 14 is formed on the second surfaces 10b of each base plate 10, respectively, and the clipping portion 22 of the clip 20 is located at each of the clip areas 14, so that each of the base plates 10 make contact with the upper and lower surfaces of the memory module M, respectively, by the clip 20.

However, the above conventional fin-type heat sink 90 has a problem in that the dissipating fin 12 corresponding to the clipping area 14 is removed from the second surface 10b of the base plate 10 to thereby reduce the efficiency of the heat dissipation.

The dissipating fins 12 corresponding to the clipping area 14 are removed from the second surface 10b along the first direction I, and thus the surface areas of the dissipating fins 12 are diminished due to the removed portions of the dissipating fins 12. In addition, the clipping area 14 is located on the second surface 10b of the base plate 10 at both of the upper and lower surfaces of the memory module M, and thus the loss of the surface area is significantly increased in the conventional fin-type heat sink 90. A recent electronic instrument generally has a longer memory module and thus requires more clips for clipping the base plates 10 to the long memory module, and thus the surface area of the dissipating fin may be decreased by geometric progression in the fin-type heat sink.

Accordingly, there is still a need for an improved fin-type heat sink for optimizing the efficiency of the heat dissipation. When the memory module is used in a server unit for a computer system, the efficiency of the heat dissipation becomes more important because of poor air circulation in the server unit.

SUMMARY

Example embodiments of the present general inventive concept provide an apparatus to dissipate heat and a heat sink having high efficiency of heat dissipation.

Additional aspects and utilities of the present general inventive concept will be set forth in part in the description which follows and, in part, will be obvious from the description, or may be learned by practice of the general inventive concept.

According to example embodiments and utilities of the present general inventive concept, there is provided a heat sink including a first base plate making contact with a first surface of a heat source, a second base plate making contact with a second surface of the heat source and a coupling member for combining the first and second base plates. The first base plate includes a support unit that is protruded from a first surface and spaced apart from an edge portion by a first gap distance and a first dissipating unit through which heat is dissipated from the heat source on a second surface opposite to the first surface. The second base plate includes a penetrating hole spaced apart from an edge portion by a second gap distance and holding the support unit therein and a second dissipating unit through which the heat is dissipated from the heat source on a second surface opposite to the second surface of the heat source. The coupling member is positioned on an upper surface of the support unit and applying a force to the first and second base plates to thereby combine the first and second base plates to the heat source.

The first and second dissipating units may protrude from the second surfaces of the first and second base plates, respectively, so that the first and second dissipating units integrally mounted on the first and second base plates in a body. For example, the first and second dissipating units may include a plurality of dissipating lines spaced apart from each other by an interval and each of the dissipating lines extends in parallel with a longitudinal direction of the first and second base plates.

The first and second base plates may be symmetrical with each other with respect to the heat source, so that the first surface of the first base plate makes contact with the first surface of the heat source and a first surface of the second base plate, which is opposite to the second surface of the second base plate, makes contact with a second surface of the heat source, which is opposite to the first surface of the heat source, to thereby arrange the dissipating units to face away from the heat source on the second surfaces of the first and second base plates.

A first thermal conductive contact pad may be further interposed between the first surface of the first base plate and the first surface of the heat source and a second thermal conductive contact pad is further interposed between the first surface of the second base plate and the second surface of the heat source, so that the first and second base plates are adhered to the heat source and the heat is transferred to the first and second base plates from the heat source through the first and second thermal conductive contact pads. For example, the first and second thermal conductive contact pads may include one of a structural acrylic resin and an epoxy resin having thermal conductive materials.

The coupling member may include an elastic coupler having a body making contact with a surface of the support member, a first wing making contact with the body and a peripheral portion of the first surface of the first base plate and applying an elastic force to the first base plate and a second wing making contact with the body and a peripheral portion of a first surface opposite to the second surface of the second base plate and applying the elastic force to the second base plate, so that a first momentum is applied to the first base plate in a first direction and a second momentum is applied to the second base plate in a second direction opposite to the first direction, and thus the first base plate may be compressed toward the first surface of the heat source and the second base plate may be compressed toward the second surface of the heat source.

The elastic coupler may be located at a side of the heat source in a fixing space defined by the upper surface of the support unit and the first surfaces of the first and second base plates and a lower surface opposite to the upper surface of the support unit makes contact with an edge portion of the substrate, so that a relative position of the heat source with respect to the first and second base plates is determined on the basis of the lower surface of the support unit. The first and second base plates may further include first and second stepped portions that are protruded from the first surfaces of the first and second base plates at edge portions, respectively, so that the first wing of the coupling member is supported by the first base plate and the first stepped portion and the second wing of the coupling member is supported by the second base plate and the second stepped portion. The elastic coupler includes a rubber, a corned disc spring and an air spring.

The heat source may include a memory module having a substrate, at least one semiconductor chip package that is positioned on the substrate and performs an electric operation and at least one terminal for communicating electrical data with surroundings. The semiconductor chip package may include a dynamic random access memory (DRAM) package and a flash memory package and the terminal includes a contact pad arranged on a peripheral portion of the substrate.

According to the example embodiments and utilities of the present general inventive concept, the dissipating units may not be removed from the second surfaces of the first and second surfaces of the first and second base plates, to thereby prevent the loss of the surface area of the dissipating units and to optimize the dissipation efficiency of the heat sink. When the memory module is used in a server unit for a computer system having poor heat transfer characteristics, the efficiency of the heat dissipation may be remarkably improved to thereby increase the operation reliability of the server unit.

According to some example embodiments and utilities of the present invention general inventive concept, there is provided a heat sink including a first base plate having a support unit and first and second areas disposed opposite to each other with respect to the support unit, a second base plate having a hole to corresponding to the support unit and first and second areas disposed opposite to each other with respect to the hole, a dissipating unit disposed on the second areas of the first and second base plates to dissipate heat, and a coupling unit disposed on the first areas of the first and second base plates.

The heat sink may further include a heat source disposed between the second areas of the first and second base plates.

The support unit and the hole may be disposed in an outside of an area of the dissipating unit.

The dissipating unit may be disposed on a line, and the coupling unit may be disposed outside the line.

The first area may not overlap the second area.

The coupling unit may include a body and at least two wings extended from the body in a direction away from the support unit toward an edge portion of the first or second base plate in the first area.

The dissipating unit may include a plurality of dissipating units disposed outside an area where the plurality of dissipating units is located.

According to some example embodiments and utilities of the present invention general inventive concept, there is provided an electronic apparatus including a processing unit to process data, and a memory unit to store the data, and the memory unit having a heat sink having a first base plate having a support unit and first and second areas disposed opposite to each other with respect to the support unit, a second base plate having a hole to corresponding to the support unit and first and second areas disposed opposite to each other with respect to the hole, a dissipating unit disposed on the second areas of the first and second base plates to dissipate heat, and a coupling unit disposed on the first areas of the first and second base plates.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
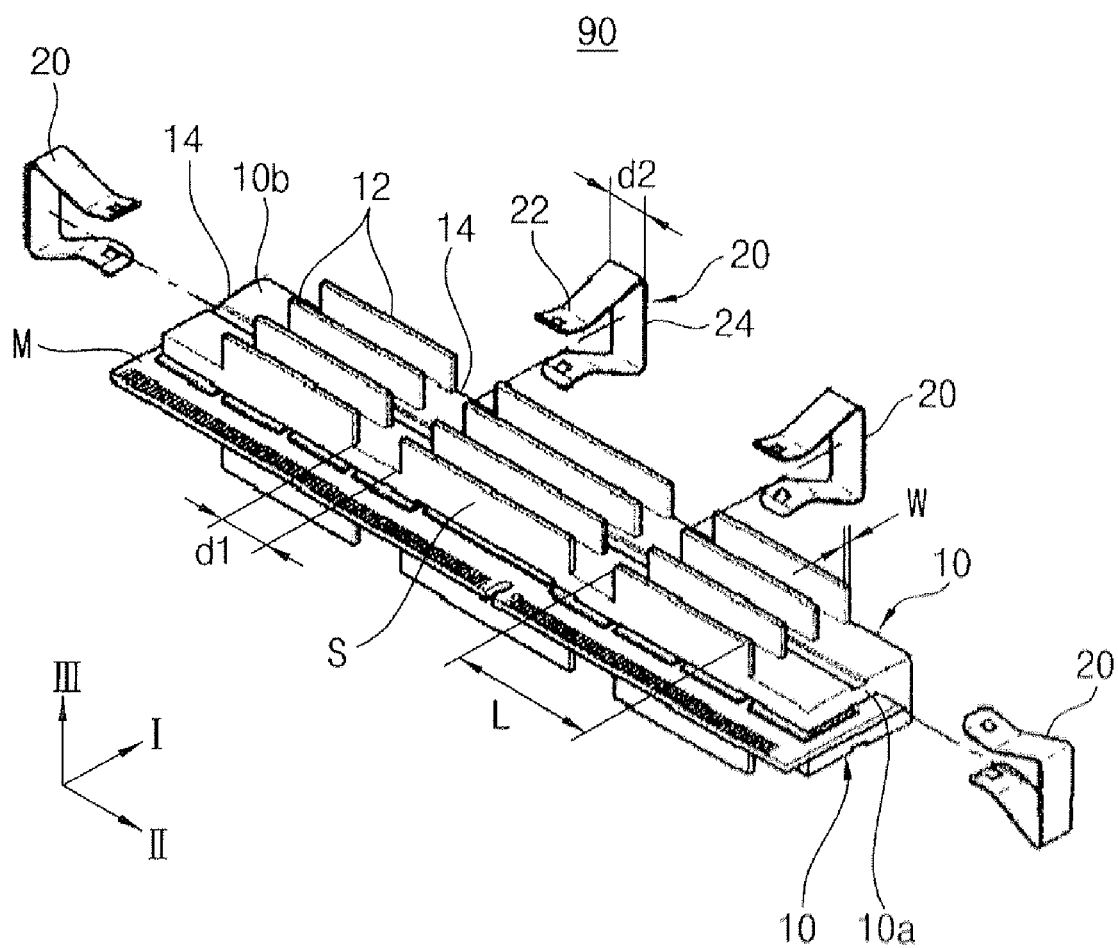
FIG. 1 is a perspective view illustrating a conventional fin-type heat sink for dissipating heat from a memory module.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present general inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present general inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the general inventive concept are described herein with reference to cross-sectional illustrations that are schematic illustrations of idealized example embodiments (and intermediate structures) of the present general inventive concept. As such, variations from the shapes of the illustrations as a result, for example, of manufacturing techniques and/or tolerances, are to be expected. Thus, example embodiments of the present general inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present general inventive concept.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present general inventive concept will be explained in detail with reference to the accompanying drawings.

Figure 2A:
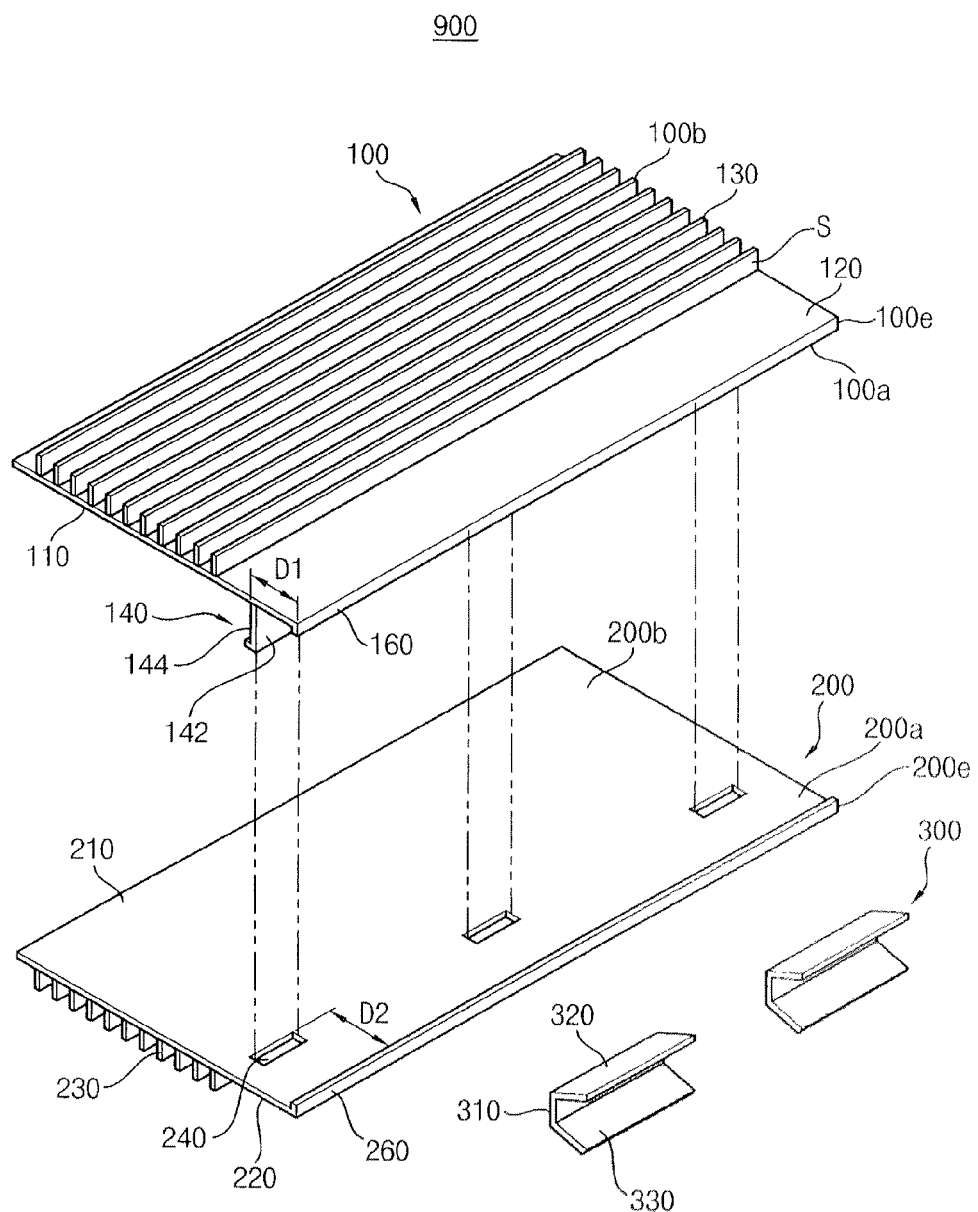
FIG. 2A is an exploded perspective view illustrating a heat sink according to an embodiment of the present general inventive concept.
Figure 2B:
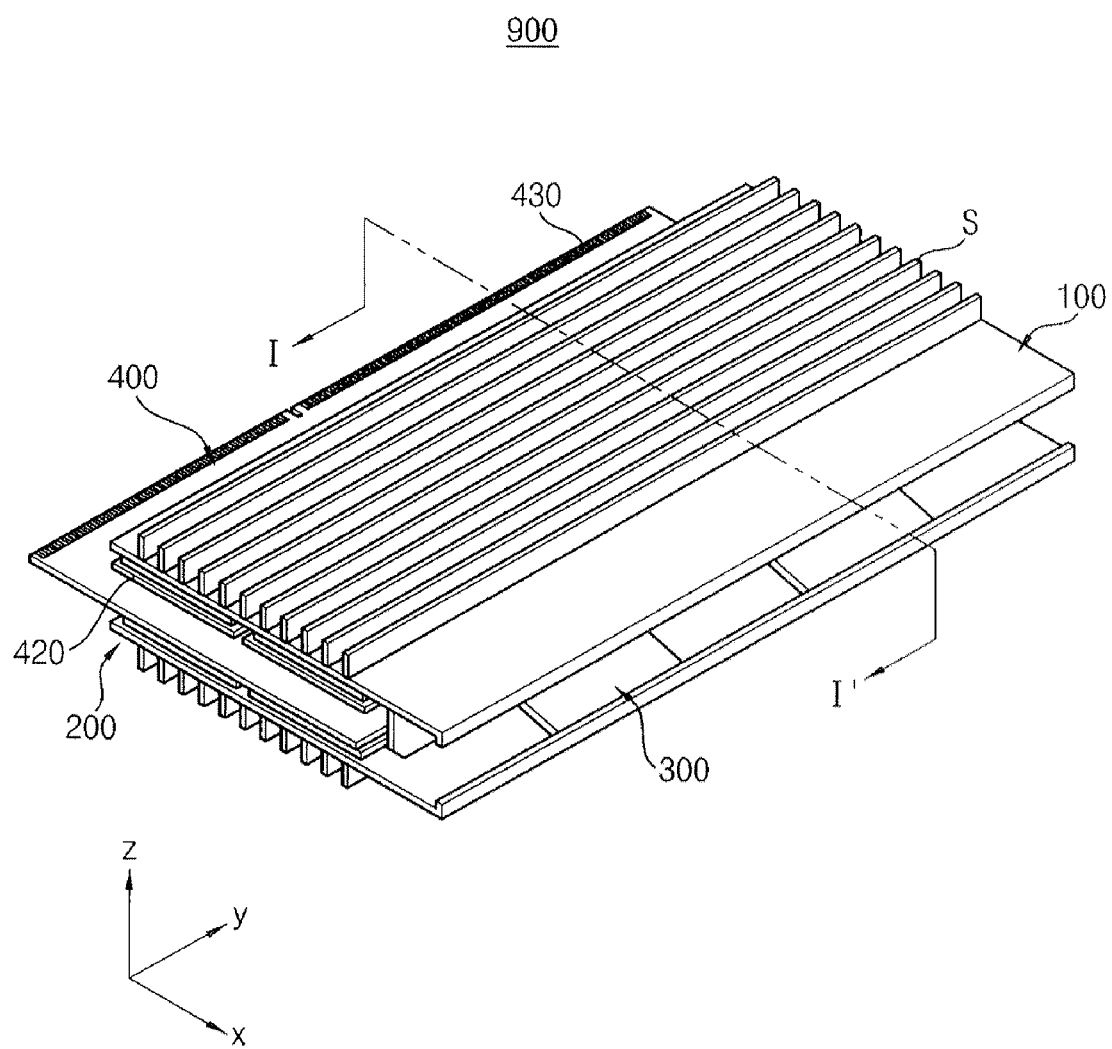
FIG. 2B is a perspective view illustrating a combined structure of a heat source and the heat sink illustrated in FIG. 2A.
Figure 3:
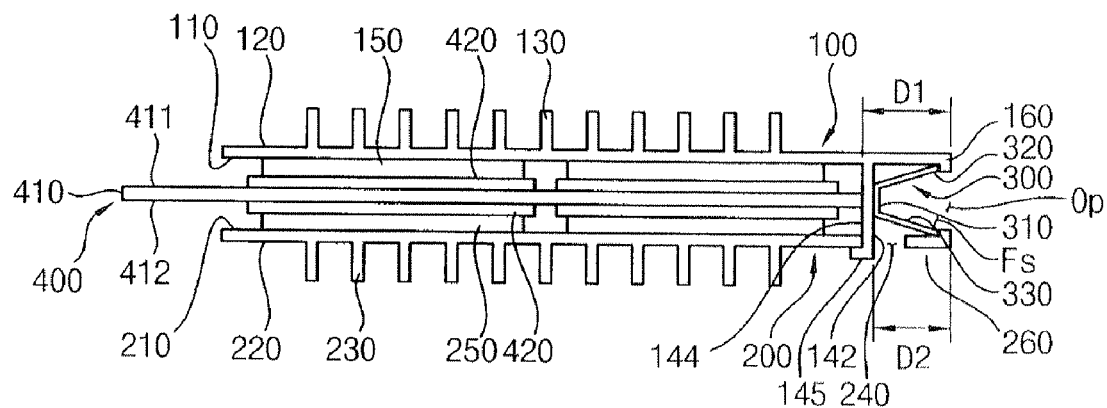
FIG. 3 is a cross-sectional view taken along a line I-I' of FIG. 2B.

FIG. 2A is an exploded perspective view illustrating a heat sink 900 as an apparatus to dissipate heat according to an embodiment of the present general inventive concept, and FIG. 2B is a perspective view illustrating a combined structure of a heat source and the heat sink illustrated in FIG. 2A. FIG. 3 is a cross-sectional view taken along a line I-I' of FIG. 2B.

Referring to FIGS. 2A, 2B and 3, the heat sink 900 according to an embodiment of the present general inventive concept may include first and second base plates 100 and 200 between which a heat source 400 is interposed, and a coupling unit 300 to couple the first and second base plates 100 and 200.

In an embodiment, the heat source 400 may include a heat-generating object in which one or more various heats are generated in accordance with electrical operations and physical and/or chemical reactions therein. For example, the heat source 400 may include a memory module having a substrate 410, a semiconductor chip package 420 and at least one terminal 430 to be connected to an external device. The semiconductor chip package 420 may be positioned on the substrate 410 and perform various electrical operations and may communicate with surroundings, such as an external device or additional apparatus, through the terminal 430 as electrical data.

In an example embodiment, the semiconductor chip package 420 may include a dynamic random access memory (DRAM) package or a flash memory package and the terminal 430 may include a contact pad arranged along a peripheral portion of the substrate 410 to provide communication and date exchange between the semiconductor chip package 420 and an external device. For example, when the contact pad of the terminal 430 is inserted into a slot of a main board in a desktop computer system, i.e., an external device, a DRAM can be utilized as a main memory mounted on the main board of the desktop computer system and can also be used as a main memory (heat generating unit) of the semiconductor chip package 420. The semiconductor chip package 420 may be located on both upper and lower surfaces 411 and 412 of the substrate 410, so that the number of the chip packages 420 may be doubled in the same substrate 410. Once the memory module is electrically operated, heat is generated from each of the chip packages 420.

Hereinafter, a direction in which the terminal 430 is arranged is referred to as y-direction and a direction perpendicular to the y-direction is referred to as x-direction. A direction perpendicular to the x and y directions to thereby penetrate the memory module is referred to as z-direction.

In an example embodiment, the first base plate 100 may include a thermal conductive plate and have a first surface 110 facing the upper surface 411 of the substrate 410 and a second surface 120 opposite to the first surface 110 and away from the heat source 400. The first surface 110 of the base plate 100 may make contact with the semiconductor chip package 420 located on the upper surface 411 of the substrate 410. A first dissipating unit 130 may be located on the second surface 120 of the base plate 100, and thus the heat generated from the chip packages 420 may be dissipated to surroundings through the first dissipating unit 130.

For example, the thermal conductive plate may include a polybutylene terephthalate (PBT)-based or a polytetrafluoroethylene (PTFE)-based plastic plate and a metal plate having an excellent malleability and ductility such as aluminum (Al).

In an example embodiment, the first base plate 100 may include a support unit 140. The support unit 140 may protrude toward the second base plate 200 from the first surface 110 of the first base plate 100 in a direction opposite to a direction z of the Cartesian coordinate system illustrated in FIG. 2A, and may be spaced apart from a first edge portion 100e of the base plate 100 by a first gap distance D1. The support unit 140 may have a plurality of supporting units 140 arranged in a direction y and spaced-apart from each other by a distance. The support unit 140 may be inserted into a penetration hole 240 of the second base plate 200 to thereby combine the first and second base plate 100 and 200 together with each other.

The penetrating hole 240 may have a plurality of penetrating hole 240 to corresponding to the respective supporting members 140 such that a distal end 145 is inserted into the corresponding penetrating hole 240 and then can hold the second base plate 200 with respect to the first base plate 100 while a coupling unit 300 is disposed in an area formed between first areas 100a and 200a of the first and second base plates 100 and 200 and a heat source is disposed in an area formed between second areas 100b and 200b of the first and second base plates 100 and 200.

In an example embodiment, a plurality of the first dissipating units 130 is arranged on the second surface 120 of the first base plate 100 in the y-direction and may be spaced apart from each other by a predetermined interval in the x-direction. A length of the first dissipating unit 130 in the y-direction may be longer than a width thereof in the x-direction. The length of the first dissipating unit 130 may not have a cutout portion or a discontinued portion to provide a space to accommodate a conventional coupling unit to couple the first and second base plates 100 and 200. Accordingly, the first dissipating unit 130 can have a sufficiently large surface area S through which the heat is dissipated from the first dissipating units 130 and/or a heat source. Also, the first dissipating unit 130 does not have to have a cut out portion to accommodate a clip portion of a coupling unit which can couple the first and second base plates 100 and 200, so that the heat-dissipating area is not decreased. Accordingly, the heat generated from the heat source, i.e., the chip packages 420, may be transferred to the first surface 110 of the first base plate 100 and be rapidly dissipated to surroundings through the surface area S of the first dissipating unit 130.

Although FIG. 2B shows the first dissipating units 130 arranged in the direction y, it is possible that the first dissipating units 130 are arranged in the direction x or are arranged to have an angle with respect to the direction z or x.

The support unit 140 and the first dissipating unit 130 may be integrally formed on the first and second surfaces 110 and 120 of the first base plate 100, respectively, in a body together with the first base plate 100. For example, the support unit 140 may protrude from a peripheral portion of the first surface 110 and a plurality of the dissipating units 130 may protrude from the second surface 120 in an extrusion process for forming the first base plate 100.

Because the first base plate 100 can be formed with a material having an excellent thermal conductivity, the heat dissipation from the chip packages 420 may be determined by the dissipation characteristics of the first dissipating unit 130 and/or the heat transfer characteristics of the first base plate 110. It is possible that the heat dissipation from the chip packages 420 may be determined by the dissipation characteristics of the first dissipating unit 130 more than the heat transfer characteristics of the first base plate 110. A first thermal conductive contact pad 150 may be interposed between the first surface 110 of the first base plate 100 and the chip packages 420, so that the heat source 400 may be adhered to the first base plate 100 with improved thermal conductivity between the heat source 400 and the first base plate 100.

In an example embodiment, the first contact pad 150 may include HERNON 120 (name of a product manufactured by HERNON Manufacturing, Inc., of the U.S.A.) having ethylene and having a viscosity of about 700 and RESBOND 920 (name of product manufactured by KOTRONICS, Inc., of Korea) which is a kind of a conductive epoxy having an excellent thermal conductivity such as silver (Si). HERNON 120 includes a thermal conductive structural acrylic adhesive and is advantageous for the bonding of the dissipating unit 130 and RESBOND 920 has excellent adhesive characteristics as well as excellent thermal conductivity.

In an example embodiment, the second base plate 200 may include a thermal conductive plate and have a first surface 210 facing a lower surface 412 of the heat source 400 and a second surface 220 opposite to the first surface 210 and away from the heat source 400.

The first surface 210 of the second base plate 200 may make contact with the semiconductor chip package 420 located on the lower surface 412 of the substrate 410. A second dissipating unit 230 may be located on the second surface 220 of the base plate 200 to dissipate the heat generated from the chip packages 420 to an outside thereof through the second dissipating unit 230. In an example embodiment, the second base plate 200 may include a penetration hole 240. The penetration hole 240 may be formed at a position of the first surface 210 of the second base plate 200 while penetrating through the second base plate 200 from the first surface 210 to the second surface 220, and may be spaced apart from a second edge portion 200e of the second base plate 200 by a second gap distance D2. For example, the penetrating hole 240 may be arranged in the second base plate 200 in accordance with the support unit 140 on the first base plate 100.

In an example embodiment, any plate can be used as the thermal conductive plate for the second base plate 200 on condition that the plate has sufficient thermal conductivity and processing ductility. For example, the second base plate 200 may be the same thermal conductive plate as the first base plate 100, and thus the second base plate 200 may include a polybutylene terephthalate (PBT)-based or a polytetrafluoroethylene (PTFE)-based plastic plate or a metal plate having an excellent malleability and ductility such as aluminum (Al).

In an example embodiment, the second dissipating unit 230 and the penetrating hole 240 may be integrally formed on the second base plate 200 in a one body. For example, the second dissipating unit 230 may protrude from the second surface 220 of the second base plate 200, and other portions of a peripheral portion of the second base plate 200 are removed to thereby form the penetrating hole 240 in an extrusion process for forming the second base plate 200. A length of the second dissipating unit 230 in the y-direction may be much longer than a width thereof in the x-direction, and as a result, the second dissipating unit 230 has a sufficiently large surface area S through which the heat is dissipated to surroundings. For example, the second dissipating unit 230 may have the same configuration and shape as the first dissipating unit 130, and thus a plurality of the second dissipating units 230 may extend in the y-direction and be spaced apart from each other by a predetermined interval in the x-direction on the second surface 220 of the second base plate 200. Accordingly, the heat generated from the chip packages 420 may be transferred to the second surface 210 of the second base plate 200 and be rapidly dissipated to surroundings through the surface area S of the second dissipating unit 230.

A second thermal conductive contact pad 250 may be further interposed between the first surface 210 of the second base plate 200 and the chip packages 420, so that the heat source 400 may be attached to the second base plate 200 to improve thermal conductivity between the heat source 400 and the second base plate 200. The second base plate 200 may be formed with a material having an excellent thermal conductivity so that the heat dissipation from the chip packages 420 may be determined by the dissipation characteristics of the second dissipating unit 230 and/or the heat transfer characteristics of the second base plate 210. It is possible that the heat dissipation from the chip packages 420 may be determined by the dissipation characteristics of the second dissipating unit 230 more that the heat transfer characteristics of the second base plate 210. In the present example embodiment, the second thermal conductive contact pad 250 may have the same configuration and shape as the first thermal conductive contact pad 150, and thus any further descriptions on the second thermal conductive contact pad 250 will be omitted.

The penetrating holes 240 are spaced apart from the second edge portion 200e of the second base plate 200 by the second gap distance D2 to correspond to the respective support units 140 protruding from the first surface 110 of the first base plate 100. In the present example embodiment, the second gap distance D2 may be controlled for insertion of the support unit 140 into the penetrating hole 240. For example, the first gap distance D1 may include a distance between the first edge portion 100e of the first base plate 100 and a center of the support unit 140, and the second gap distance D2 may include a distance between the second edge portion 200e of the second base plate 200 and a center of the penetrating hole 240. Accordingly, when the supporting unit 140 is inserted into the penetrating hole 240, the supporting unit 140 can be biased toward the second area 200a of the second base plate 200 such that a distal end 145 of the supporting unit 140 can hold the second base plate 200 so as to prevent the second base plate 200 from being detached from the supporting unit 140. The first gap distance D1 may be the same as the second gap distance D2. The support unit 140 may be inserted into the penetrating hole 240 and make contact with the second surface 220 of the second base plate 200, and thus the first and second base plates 100 and 200 are systematically combined into a pair of base plates. The heat source 400 may be interposed between the pair of the base plates 100 and 200. For example, the first and the second base plates 100 and 200 may be symmetrically positioned with respect to the heat source 400, and thus the first surface 110 of the first base plate 100 may make contact with the upper surface 411 of the substrate 410 and the first surface 210 of the second base plate 200 may make contact with the lower surface 412 of the substrate 410. As a result, the first and second dissipating units 130 and 230 may be arranged facing away from the heat source 400.

The coupling unit 300 may be located on a first surface 142 of the support unit 140. The first and second base plates 100 and 200 are coupled to the heat source 400 disposed in the second areas of the first and second base plates 100 and 200 by an external force of the coupling unit 300 since the support unit 140 is located between the first and second areas 100a and 100b of the first base plate 100, and the coupling unit 300 is also located at the first areas 100a and 200a of the first and second base plates 100 and 200. In the present example embodiment, the first edge portion 100e is opposite to the terminal 430 of the memory module 400, so that the terminal 430 of the memory module 400 may be exposed to surroundings although the memory module 400 is coupled to the heat sink 900.

In an example embodiment, the coupling unit 300 may include an elastic coupler having a body 310 making contact with the first surface 142 of the support unit 140, a first wing 320 making contact with a peripheral portion of the first surface 110 of the first base plate 100 and/or a first stepped portion 160 to apply an elastic force to the first base plate 100 and a second wing 330 making contact with a peripheral portion of the first surface 210 of the second base plate 200 and/or a second stepped portion 260 to apply the elastic force to the second base plate 100. For example, the elastic coupler for the coupling unit 300 may include a rubber, a corned disc spring, an air spring, etc.

The coupling unit 300 may be located at a side of the heat source 400 in a fixing space Fs which is defined by the first surface 142 of the support unit 140 and the first surfaces 110 and 210 of the first and second base plates 100 and 200. A lower surface 144 of the supporting unit 140 is disposed opposite to the first surface 142 of the support unit 140 to make contact with a first edge portion of the substrate 410, which is opposite to the terminal 430 of the memory module 400 disposed a second edge of the substrate 410, and thus a relative position of the heat source 400 with respect to the first and second base plates 100 and 200 may be determined on a basis of the lower surface 144 of the support unit 140. Therefore, when the heat sink 900 and the memory module 400 are combined to each other, the first edge portion of the substrate 410 is firstly brought into contact with the lower surface 144 of the support unit 140, and then the first and second contact pads 150 and 250 are brought into contact with the chip packages 420 of the memory module 400, to thereby prevent a misalignment between the heat sink 900 and the memory module 400 and prevent efficiency reduction caused by the misalignment.

In an example embodiment, the first and second base plates 100 and 200 may further include first and second stepped portions 160 and 260, respectively, that protrude from the first surfaces 110 and 210 of the first and second base plates 100 and 200 at the first and second edge portions 100e and 200e, respectively. The first stepped portion 160 may protrude from an edge portion of the first surface 110 of the first base plate 100 in the direction opposite to the z-direction to be parallel with the support unit 140, and the second stepped portion 260 may be protruded from an edge portion of the first surface 210 of the second base plate 200 in the direction opposite to the z-direction to be parallel with the supporting unit 140. Accordingly, the first and second stepped portions 160 and 260 may face each other and an opening Op is formed between the first and second stepped portions 160 and 260. The elastic coupler 300 may be inserted into the fixing space Fs through the opening Op.

The first wing 320 may be supported by the first base plate 100 and the first stepped portion 160 and the second wing 330 may be supported by the second base plate 200 and the second stepped portion 260.

An elastic coupler may be used as the coupling unit 300 and may be compressed by an external force, and the compressed elastic coupler 300 may be inserted into the fixing space Fs. Then, a coupling force may be applied to the first base plate 100 by the first wing 320 and may be applied to the second base plate 200 by the second wing 330 due to an elastic force of the elastic coupler 300. As a result, a first momentum may be applied to the first area 100a of the first base plate 100 counterclockwise with respect to a center of gravity of the body 310 and a second momentum may be applied to the first area 200a of the second base plate 200 clockwise with respect to a center of gravity of the body 310. Therefore, the second area 100b of the first base plate 100 may be biased and/or compressed toward the first surface 411 of the substrate 410 and second area 200b of the second base plate 200 may be biased and/or compressed toward the second surface 412 of the substrate 410. Accordingly, the first and second base plates 100 and 200 may be secured to the heat source 400 by the compressive force caused by the coupling unit 300 and the adhesive force caused by the contact pads 150 and 250.

The memory module and the heat sink 900 may be combined to each other as follows.

The first contact pad 150 of the first base plate 100 may be brought into contact with the semiconductor chip packages on the first surface 411 of the substrate 410 while maintaining the contact between the first edge portion of the substrate 410 and the lower surface of the support unit 140. Then, the second base plate 200 may be combined to the first base plate 100 in such a configuration that the support unit 140 is inserted into the penetrating hole 240. As a result, the chip packages on the second surface 412 of the substrate 410 may come into contact with the second contact pad 250 of the second base plate 200. Then, the coupling unit 300 may be inserted into the fixing space Fs through the opening between the first and second stepped portions 160 and 260. A compressed elastic coupler may be inserted into the fixing space Fs as the coupling unit 300 in such a configuration that the body 310 of the coupling unit 300 makes contact with the first surface 142 of the support unit 140 and the first and second wings 320 and 330 make contact with the edge portions of the first and second surfaces 110 and 210 of the first and second base plates 100 and 200. The first and second stepped portions 160 and 260 may improve the contact reliability between the first and second wings 320 and 330 and the first surfaces 110 and 210 of the first and second base plates 100 and 200. The first and second wings 320 and 330 may apply moments, which are opposite to each other and are caused by an elastic force of the coupling unit 300, to the first and second base plates 100 and 200, respectively, at a side of the heat source 400, so that the first and second base plates 100 and 200 are compressed toward the heat source by the moments.

Therefore, the base plates 100 and 200 may be combined to the memory module 400 without any loss of the surface area of the dissipating fin, to thereby improve the dissipation efficiency of the heat sink 900.

Figure 4:
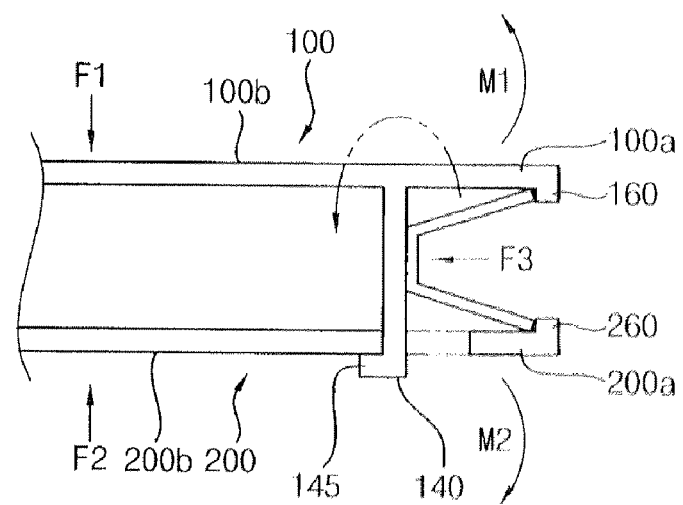
FIG. 4 is a view illustrating the heat sink of FIGS. 2A-3.

FIG. 4 illustrates the heat sink 900 of FIGS. 2A-3. When the coupling unit 300 is inserted into the fixing space Fs of the heat sink 900, the coupling unit 300 may generate a force exerted on the first area 100a of the first base plate 100 to correspond to a momentum M1, a force exerted on the first area 200a of the second base plate 200 to correspond to a momentum M2, and a force F3 exerted on the support unit 140 to move at least a portion of the support unit 140 within the penetrating hole 240 in a direction of the force F3 such that the distal end 145 maintains the coupling state between the second base plate 200 and the support unit 140 of the first base plate 100.

Since the first area 100a of the first base plate 100 moves with respect to the support unit 140 and/or the coupling portion of the second base plate 200 and the support member 140 of the first base plate 100, a force F1 is applied to the second area 100b of the first base plate 100 to move toward the heat source disposed between the second areas 100b and 200b of the first and second base plates 100 and 200. Also, since the first area 200a of the second base plate 200 moves with respect to the support unit 140 and/or the coupling portion of the second base plate 200 and the support unit 140 of the first base plate 100, a force F2 is applied to the second area 200b of the second base plate 200 to move toward the heat source disposed between the second areas 100b and 200b of the first and second base plates 100 and 200. Therefore, at least a combination of the forces F1 and F2 can enable the second areas 100b and 200b of the first and second base plates 100 and 200 to be attached to the heat source. Also, a contact between the heat source and at least one of the first and second base plates 100 and 200 can be maintained.

It is possible that the first areas 100a and 200a of the first and second plates 100 and 200 may have a first thickness in the direction z, and the second areas 100b and 200b of the first and second plates 100 and 200 may have a second thickness in the direction z. The support unit 140 may have a third thickness in the direction x. The third thickness may be the same as at least one of the first thickness and the second thickness. However, the third thickness may be different from the first and second thicknesses, thinner or thicker than at least one of the first and second thicknesses. It is also possible that the first thickness is different from the second thickness. Accordingly, the first and second base plates 100 and 200 may have a strength to transmit the momentum M1 and the momentum M2 of the first areas 100a and 200a to the second areas 100b and 200b as the forces F1 and F2 such that the second areas 100b and 200b of the first and second base plates 100 and 200 can be attached to the heat source.

The thickness of the first and second base plates 100 and 200 may be variable according to the length of the first and second base plates 100 and 200, and also the number of the coupling units 300 can be variable according to the strength of the first and second base plates 100 and 200 and/or the length of the dissipating unit 130 or 230.

Figure 5:
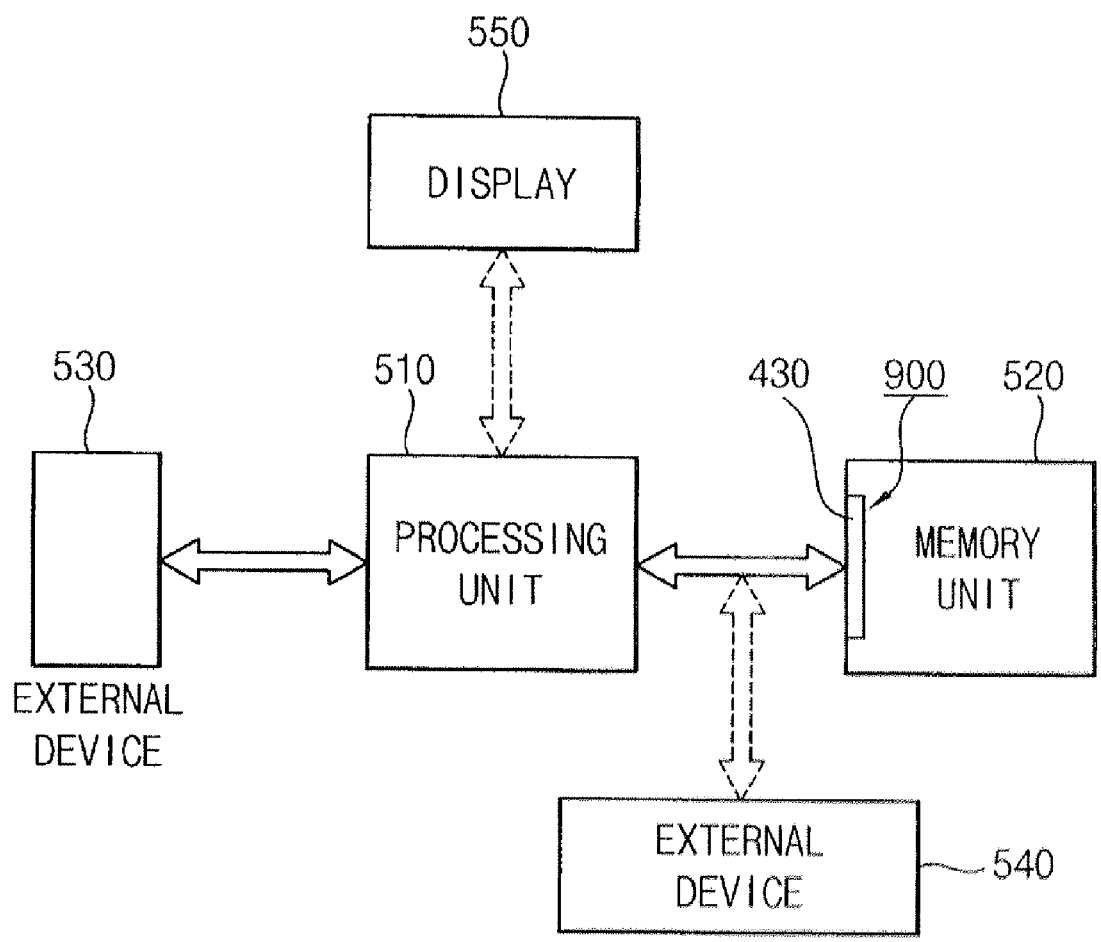
FIG. 5 is a view illustrating a system having the heat sink of FIGS. 2A-3.

FIG. 5 illustrates a system 500 having a processing unit 510 and a memory unit 520 according to an embodiment of the present general inventive concept. The system 500 may communicate with an external device 530 through a wired or wireless communication unit to receive and transmit data. The processing unit 510 may process the data to store in the memory unit 520 or may transmit the data read from the memory unit 520 to the external device 530. The memory unit 520 may have the heat sink 900 of FIGS. 2A-3b and a semiconductor chip package as a heat source disposed in the heat sink 900 such that the data can be stored therein and read therefrom.

The terminal 430 of the substrate 410 of the semiconductor chip package can be connected to the processing unit 510 and/or an external device 540 to receive data or transmit data. The terminal 430 of the substrate 410 may be detachably attached to a coupling terminal formed on a portion of the processing unit 510 and/or the external device 540.

The system may further include a display unit 550 to display an image corresponding to the data. The display unit 550 can be installed on the system 500. However, it is possible that the display unit 550 can be detachably attached to the system 500 or can be connected to the processing unit 510 of the system 500 through a wired or wireless communication unit.

The system 500 may be a computer, an electronic apparatus, a wireless communication apparatus, an image processing or forming apparatus, an image display apparatus, etc., such that data can be processed, stored, and transmitted, and such that a function of the system can be achieved by processing, storing, or transmitting the data.

According to some example embodiments of the present general inventive concept, no clip area, in which the coupling unit is located so as to combine the first and second base plates 100 and 200, is required on the second surfaces 120 and 220 of the base plates 100 and 200. That is, the dissipating fins are not removed from the second surfaces of the first and second surfaces of the first and second base plates 100 and 200, to thereby prevent the loss of the surface area S of the dissipating fins and to optimize the dissipation efficiency of the heat sink. Further, the support unit for supporting the coupling unit is utilized as a baseline for the alignment of the substrate of the memory module and the heat sink, to thereby prevent the misalignment between the memory module and the heat sink without any additional base line.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A heat sink comprising:
a first base plate facing a first surface of a heat source, the first base plate including a support unit protruding from a first surface of the first base plate and spaced apart from an edge portion of the first base plate by a first gap distance and a first dissipating unit formed on a second surface opposite to the first surface of the first base plate to dissipate heat generated from the heat source;
a second base plate facing a second surface of the heat source, the second base plate including a penetrating hole spaced apart from an edge portion of the second base plate by a second gap distance to hold the support unit therein and a second dissipating unit formed on a second surface of the second base plate to dissipate the heat generated from the heat source; and
a coupling member positioned on an upper surface of the support unit to apply a force to the first and second base plates to thereby combine the first and second base plates to the heat source.

2. The heat sink of claim 1, wherein the first and second dissipating units protrude from the second surfaces of the first and second base plates, respectively, so that the first and second dissipating units are integrally mounted on the first and second base plates in a body.

3. The heat sink of claim 2, wherein the first and second dissipating units include a plurality of dissipating lines spaced apart from each other by an interval and each of the dissipating lines extends in parallel with a longitudinal direction of the first and second base plates.

4. The heat sink of claim 1, wherein the first and second base plates are symmetrical with each other with respect to the heat source, so that the first surface of the first base plate makes contact with the first surface of the heat source and a first surface of the second base plate, which is opposite to the second surface of the second base plate, makes contact with a second surface of the heat source, which is opposite to the first surface of the heat source, to thereby arrange the dissipating units to face away from the heat source on the second surfaces of the first and second base plates.

5. The heat sink of claim 4, further comprising:
a first thermal conductive contact pad interposed between the first surface of the first base plate and the first surface of the heat source; and
a second thermal conductive contact pad interposed between the first surface of the second base plate and the second surface of the heat source,
wherein the first and second base plates are attached to the heat source, and the heat is transferred to the first and second base plates from the heat source through the first and second thermal conductive contact pads.

6. The heat sink of claim 5, wherein the first and second thermal conductive contact pads include one of a structural acrylic resin and an epoxy resin having thermal conductive materials.

7. The heat sink of claim 1, wherein the coupling member includes:
an elastic coupler having a body making contact with the surface of the support unit;
a first wing making contact with the body and a peripheral portion of the first surface of the first base plate and applying an elastic force to the first base plate; and
a second wing making contact with the body and a peripheral portion of a first surface opposite to the second surface of the second base plate and applying the elastic force to the second base plate, such that a first momentum is applied to the first base plate in a first direction and a second momentum is applied to the second base plate in a second direction opposite to the first direction, and thus the first base plate is compressed toward the first surface of the heat source and the second base plate is compressed toward the second surface of the heat source.

8. The heat sink of claim 7, wherein the elastic coupler is located at a side of the heat source in a fixing space defined by the upper surface of the support unit and the first surfaces of the first and second base plates, and a lower surface opposite to the upper surface of the support unit makes contact with an edge portion of the heat source, such that a relative position of the heat source with respect to the first and second base plates is determined on a basis of the lower surface of the support unit.

9. The heat sink of claim 8, wherein the first and second base plates further include first and second stepped portions that are protruded from the first surfaces of the first and second base plates at edge portions, respectively, such that the first wing of the coupling member is supported by the first base plate and the first stepped portion and the second wing of the coupling member is supported by the second base plate and the second stepped portion.

10. The heat sink of claim 7, wherein the elastic coupler includes one or a rubber, a corned disc spring and an air spring.

11. The heat sink of claim 1, wherein the heat source includes a memory module having a substrate, at least one semiconductor chip package that is positioned on the substrate and performs an electric operation and at least one terminal for communicating electrical data with surroundings.

12. The heat sink of claim 11, wherein the semiconductor chip package includes a dynamic random access memory (DRAM) package and a flash memory package and the terminal includes a contact pad arranged on a peripheral portion of the substrate.

13. A heat sink comprising:
a first base plate having a support unit and first and second areas disposed opposite to each other with respect to the support unit;
a second base plate having a hole joining to the support unit and first and second areas disposed opposite to each other with respect to the hole;
a dissipating unit disposed on the second areas of the first and second base plates to dissipate heat; and
a coupling unit disposed on the first areas of the first and second base plates such that the coupling unit does not contact the second areas of the first and second base plates.

14. The heat sink of claim 13, further comprising:
a heat source disposed between the second areas of the first and second base plates.

15. The heat sink of claim 13, wherein the support unit and the hole are disposed in an outside of an area of the dissipating unit.

16. The heat sink of claim 13, wherein the dissipating unit is disposed on a line, and the coupling unit is disposed outside the line.

17. The heat sink of claim 13, wherein the first area of the first base plate does not overlap the second area of the first base plate.

18. The heat sink of claim 13, wherein the coupling unit comprises a body and at least two wings extended from the body in a direction away from the support unit toward an edge portion of the first area of the first base plate.

19. An electronic apparatus comprising:
a processing unit to process data; and
a memory unit to store the data, and having a heat sink having:
a first base plate having a support unit and first and second areas disposed opposite to each other with respect to the support unit;
a second base plate having a hole joining to the support unit and first and second areas disposed opposite to each other with respect to the hole;
a dissipating unit disposed on the second areas of the first and second base plates to dissipate heat; and
a coupling unit disposed on the first areas of the first and second base plates such that the coupling unit does not contact the second areas of the first and second base plates.

* * * * *